US011948819B2

(12) United States Patent
Mori

(10) Patent No.: US 11,948,819 B2
(45) Date of Patent: Apr. 2, 2024

(54) METHOD OF EVALUATING SILICON WAFER, METHOD OF EVALUATING SILICON WAFER MANUFACTURING PROCESS, METHOD OF MANUFACTURING SILICON WAFER, AND SILICON WAFER

(71) Applicant: SUMCO CORPORATION, Tokyo (JP)

(72) Inventor: Keiichiro Mori, Saga (JP)

(73) Assignee: SUMCO CORPORATION, Tokyo (JP)

( * ) Notice: Subject to any disclaimer, the term of this patent is extended or adjusted under 35 U.S.C. 154(b) by 1075 days.

(21) Appl. No.: 16/335,059

(22) PCT Filed: Jun. 14, 2017

(86) PCT No.: PCT/JP2017/021885
§ 371 (c)(1),
(2) Date: Mar. 20, 2019

(87) PCT Pub. No.: WO2018/061337
PCT Pub. Date: Apr. 5, 2018

(65) Prior Publication Data
US 2019/0279890 A1 Sep. 12, 2019

(30) Foreign Application Priority Data

Sep. 29, 2016 (JP) .................................. 2016-191212

(51) Int. Cl.
H01L 21/67 (2006.01)
B24B 37/005 (2012.01)
(Continued)

(52) U.S. Cl.
CPC ...... H01L 21/67288 (2013.01); B24B 37/005 (2013.01); G01N 21/9501 (2013.01);
(Continued)

(58) Field of Classification Search
CPC ... H01L 21/67288; H01L 29/34; H01L 22/12; H01L 22/24; G01N 21/9501; G01N 21/956; G01Q 60/24
See application file for complete search history.

(56) References Cited

U.S. PATENT DOCUMENTS 6,320,655 B1 * 11/2001 Matsushita ........ G01N 21/9501
356/614
6,552,337 B1 * 4/2003 Cho ........................ G01B 7/34
977/852
(Continued)

FOREIGN PATENT DOCUMENTS

JP H11-145088 A 5/1999
JP 11-354598 A 12/1999
(Continued)

OTHER PUBLICATIONS

Takushi Shigetoshi, Haruyuki Inoue, Tsukasa Kawashima, Takaaki Hirokane, Toshihiko Kataoka, Mizuho Morita, and Kenta Arima; Microscratches with Depths of Angstrom Order on Si Wafers Detected by Light Scattering and AFM; Electrochemical and Solid-State Letters, 10 _7_ H206-H209 _2007 (Year: 2007).*
(Continued)

Primary Examiner — Aaron J Gray
(74) Attorney, Agent, or Firm — Greenblum & Bernstein, P.L.C.

(57) ABSTRACT

Provided is a method of evaluating a silicon wafer, the method including a first determination that determines the presence or absence of an abnormality by inspecting a surface of an evaluation-target silicon wafer with a light scattering type surface inspection device; and a second determination that determines the presence or absence of an abnormality through observing, with an atomic force microscope, a region of the surface of the evaluation-target silicon
(Continued)

wafer, where the presence of an abnormality has not been confirmed in the first determination.

6 Claims, 2 Drawing Sheets

(51) Int. Cl.
    *G01N 21/95*     (2006.01)
    *G01N 21/956*     (2006.01)
    *G01Q 60/24*     (2010.01)
    *H01L 21/66*     (2006.01)
    *H01L 29/16*     (2006.01)
    *H01L 29/34*     (2006.01)

(52) U.S. Cl.
    CPC ............ *G01N 21/956* (2013.01); *G01Q 60/24* (2013.01); *H01L 22/24* (2013.01); *H01L 29/16* (2013.01); *H01L 29/34* (2013.01)

(56) References Cited

U.S. PATENT DOCUMENTS

| | | | |
|---|---|---|---|
| 9,633,913 | B2 | 4/2017 | Mori |
| 10,261,125 | B2 | 4/2019 | Nagasawa et al. |
| 2015/0017745 | A1 | 1/2015 | Kimba et al. |
| 2015/0354947 | A1 | 12/2015 | Kondo et al. |
| 2018/0292330 | A1 | 10/2018 | Mori |

FOREIGN PATENT DOCUMENTS

| | | | |
|---|---|---|---|
| JP | 2000-269288 A | 9/2000 |
| JP | 2001-85486 A | 3/2001 |
| JP | 2002-340811 A | 11/2002 |
| JP | 2004-193529 A | 7/2004 |
| JP | 2005-019600 A | 1/2005 |
| JP | 2006-108151 A | 4/2006 |
| JP | 2008-153538 A | 7/2008 |
| JP | 2009-14346 A | 1/2009 |
| JP | 2013-038435 A | 2/2013 |
| KR | 20130079745 A | 7/2013 |
| WO | 2014/115586 A1 | 7/2014 |

OTHER PUBLICATIONS

Office Action for KR App. No. 10-2019-7004512, dated Dec. 28, 2020 (w/ translation).
Office Action for DE App. No. 112017004904.0, dated Feb. 24, 2022 (w/ translation).
Office Action for KR App. No. 10-2019-7004512 dated Mar. 27, 2020 (w/ machine translation).
Office Action for KR App. No. 10-2019-7004512, dated Oct. 27, 2020 (w/ translation).
International Search Report in International Patent Application No. PCT/JP2017/021885, dated Aug. 29, 2017, along with an English translation thereof.
International Prelminary Report on Patentability in International Patent Application No. PCT/JP2017/021885, dated Apr. 2, 2019, along with an English translation thereof.
Notice of Reasons for Refusal (Office Action) for Japanese Patent Application No. 2016-191212, dated Dec. 3, 2019; and English-language translation thereof.
Office Action for CN App. No. 201780052617.X, dated Oct. 18, 2022 (w/ translation).
Office Action for CN App. No. 201780052617.X, dated Apr. 19, 2023 (w/ translation).
Office Action for CN App. No. 201780052617.X, dated Aug. 31, 2023 (w/ translation).

\* cited by examiner

METHOD OF EVALUATING SILICON WAFER, METHOD OF EVALUATING SILICON WAFER MANUFACTURING PROCESS, METHOD OF MANUFACTURING SILICON WAFER, AND SILICON WAFER

CROSS-REFERENCE TO RELATED APPLICATIONS

This application claims the benefit of priority to Japanese Patent Application No. 2016-191212 filed on Sep. 29, 2016, which is expressly incorporated herein by reference in its entirety.

TECHNICAL FIELD

The present invention relates to a method of evaluating a silicon wafer, a method of evaluating a silicon wafer manufacturing process, a method of manufacturing a silicon wafer and a silicon wafer.

BACKGROUND ART

As an evaluation method of various kinds of abnormalities present on a silicon wafer surface, a method using a light scattering type surface inspection device is known (for example, see Japanese Unexamined Patent Publication (KOKAI) No. 2002-340811, which is expressly incorporated herein by reference in its entirety.

SUMMARY OF THE INVENTION

A light scattering type surface inspection device is a device that irradiates a surface of an evaluation-target sample with light and detects an abnormality present on the surface of the evaluation-target sample on the basis of scattered light from the surface, and is also referred to as a laser surface inspection device, a surface inspection device, a surface inspection machine, and the like. The light scattering type surface inspection device can easily evaluate the entire surface of the evaluation-target sample by scanning irradiation light, and thus is widely used for evaluating an abnormality present on a silicon wafer surface.

Abnormalities present on a silicon wafer surface include: a local shape abnormality (defect) of surface with a concave or convex shape; and a surface-adhering foreign substance referred to as a particle. The presence of such abnormalities on a surface of a silicon wafer to be used as a semiconductor substrate and/or the localization of abnormalities on a part of the surface causes lowering of device properties of a semiconductor device. Accordingly, in a manufacturing field of a silicon wafer, for example, a presence state (for example, number, distribution state) of an abnormality on the silicon wafer surface is evaluated, and on the basis of the evaluation result, management of the manufacturing process of the silicon wafer is performed so as to suppress the introduction of the abnormality onto the surface.

Furthermore, in a more miniaturized semiconductor device, even an abnormality more minute than conventional one causes deterioration of device properties. Therefore, along with further miniaturization of a semiconductor device in recent years, there have been increasing needs for providing a high-quality silicon wafer in which the introduction of a more minute abnormality onto the surface thereof has been suppressed. Under such circumstances, if an abnormality on a silicon wafer surface can be detected with higher sensitivity, it becomes possible to provide a high-quality silicon wafer in which the introduction of a more minute abnormality than conventional one onto the surface thereof is suppressed.

An aspect of the present invention provides for a novel method capable of evaluating an abnormality present on a silicon wafer surface with high sensitivity.

MEANS FOR SOLVING PROBLEMS

An aspect of the present invention relates to a method of evaluating a silicon wafer (hereinafter, also referred to simply as an "evaluation method"), the method including:

a first determination that determines the presence or absence of an abnormality by inspecting a surface of an evaluation-target silicon wafer with a light scattering type surface inspection device (hereinafter, also referred to as a "surface inspection device"); and a second determination that determines the presence or absence of an abnormality through observing, with an atomic force microscope (AFM), a region of the surface of the evaluation-target silicon wafer, where the presence of an abnormality has not been confirmed in the first determination.

The above evaluation method includes the first determination performed by a light scattering type surface inspection device and the second determination performed with an AFM. The second determination is performed in a region where the presence of an abnormality has not been confirmed in the first determination. As to evaluations of a silicon wafer, an AFM has been conventionally used for evaluating surface roughness and/or performing shape observation of an abnormality detected with a light scattering type surface device. However, the use of an AFM for detecting an abnormality in a region where no abnormality has been confirmed with a light scattering type surface inspection device is performed for the first time as a result of extensive studies by the present inventor. Accordingly, it becomes possible to detect, with an AFM, an abnormality not confirmed with a light scattering type surface inspection device, namely, a minute abnormality overlooked with a light scattering type surface inspection device. As a result, on the basis of determination results of the first determination and second determination, the presence state of an abnormality on a silicon wafer surface can be evaluated with higher sensitivity than that of an evaluation performed by using only a light scattering type surface inspection device.

In the present invention and description, the abnormality on a silicon wafer surface is used with a meaning including a concave defect, a convex defect, and a surface-adhering foreign substance. Specific embodiments of the abnormality will be described later.

In an embodiment, the abnormality is a process-induced defect.

In an embodiment, the abnormality is equal to or more than one kind of abnormalities selected from the group consisting of a concave defect and a convex defect.

In an embodiment, the evaluation-target silicon wafer is a polished wafer having a polished surface, and this polished surface is the surface where the presence or absence of an abnormality is to be determined.

In an embodiment, the abnormality is a linear defect.

In an embodiment, the linear defect includes a linear defect having a width of equal to or less than 200 nm.

In an embodiment, the second determination includes determining the presence or absence of the linear defect having a width of equal to or less than 200 nm.

A further aspect of the present invention relates to a method of evaluating a silicon wafer manufacturing process, the method including:

evaluating a silicon wafer manufactured in an evaluation-target silicon wafer manufacturing process by the above evaluation method; and determining, on the basis of a result of the above evaluation, necessity of a process maintenance work for the evaluation-target silicon wafer manufacturing process.

In an embodiment, the evaluation-target silicon wafer manufacturing process is a polished wafer manufacturing process including a polishing process, and the process maintenance work includes a process maintenance work for the polishing process.

A further aspect of the present invention relates to a method of manufacturing a silicon wafer, the method including:

manufacturing a silicon wafer in a silicon wafer manufacturing process, and further including:

evaluating at least one silicon wafer manufactured in the above silicon wafer manufacturing process by the above evaluation method;

determining, on the basis of a result of the evaluation, necessity of a process maintenance work for the silicon wafer manufacturing process; and manufacturing furthermore, when the process maintenance work has been determined to be unnecessary as a result of the determination, a silicon wafer in the above silicon wafer manufacturing process without the process maintenance work, or manufacturing furthermore, when the process maintenance work has been determined to be necessary, a silicon wafer in the above silicon wafer manufacturing process after performing the process maintenance work for the above silicon wafer manufacturing process.

In an embodiment, the above silicon wafer manufacturing process is a polished wafer manufacturing process including a polishing process, and the process maintenance work includes a process maintenance work for the polishing process.

A further aspect of the present invention relates to a method of manufacturing a silicon wafer, the method including:

preparing a silicon wafer lot containing a plurality of silicon wafers;

extracting at least one silicon wafer from the lot;

evaluating the extracted silicon wafer; and subjecting at least one silicon wafer included in the same lot as that of the silicon wafer determined to be a good product by the above evaluation to preparation for shipping as a product silicon wafer, wherein the evaluation of the above extracted silicon wafer is performed by the above evaluation method.

In an embodiment, the silicon wafer lot is a polished wafer lot.

A further aspect of the present invention relates to a silicon wafer in which no linear defect having a width of equal to or less than 200 nm is present on the surface.

In an embodiment, the above silicon wafer is a polished wafer.

According to an aspect of the present invention, it is possible to provide a silicon wafer evaluation method capable of detecting, with high sensitivity, an abnormality on a surface of a silicon wafer. The use of such an evaluation method makes it possible to provide a high-quality silicon wafer in which the introduction of a more minute abnormality onto the surface has been suppressed.

DESCRIPTION OF EMBODIMENTS

Method of Evaluating Silicon Wafer

Figure 1:
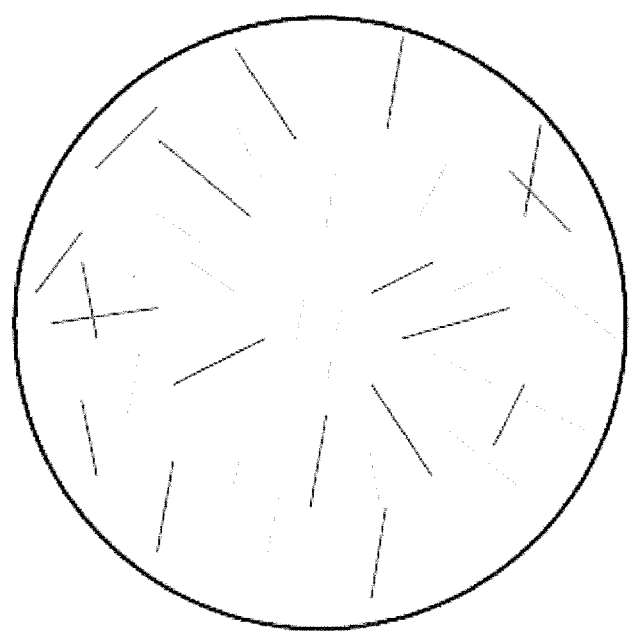
FIG. 1 illustrates a schematic view of linear defects observed on the surface of an evaluation-target polished wafer, in Example.

The method of evaluating a silicon wafer according to an aspect of the present invention includes: a first determination that determines the presence or absence of an abnormality by inspecting a surface of an evaluation-target silicon wafer with a light scattering type surface inspection device; and a second determination that determines the presence or absence of an abnormality through observing, with an atomic force microscope (AFM), a region of the surface of the evaluation-target silicon wafer, where the presence of the abnormality has not been confirmed in the first determination.

Hereinafter, the above evaluation method will be described in more detail.

Evaluation-Target Silicon Wafer, Determination-Target Abnormality

The evaluation-target silicon wafer in the above evaluation method can be various kinds of silicon wafers, and is not particularly limited. For example, the evaluation-target silicon wafer can be a silicon single crystal wafer having undergone various kinds of processing processes after having been cut out from a silicon single crystal ingot, for example, a polished wafer subjected to polishing to thereby have a polished surface on the surface. Alternatively, the evaluation-target silicon wafer can be various kinds of silicon wafers such as an epitaxial wafer having an epitaxial layer on a silicon single crystal wafer, an annealed wafer in which a modified layer is formed in a silicon single crystal wafer by an annealing treatment, and the like. Furthermore, the evaluation-target silicon wafer can be of an n-type or of a p-type. Moreover, the dopant concentration (namely, resistivity), the oxygen concentration and the like thereof are also not limited. The diameter of a surface of the evaluation-target silicon wafer is, for example, 200 mm, 300 mm or 450 mm, but is not particularly limited.

In the above evaluation method, on a surface of the evaluation-target silicon wafer, the presence or absence of an abnormality is determined through two-stage determinations of the first determination and the second determination. Such abnormalities include a concave defect, a convex defect and a surface-adhering foreign substance, as previously described.

The concave or convex defect that is an embodiment of an abnormality is a local shape abnormality on a surface, and the concave defect is a so-called groove. On the other hand, the convex defect is a local bulge (projection) on a part of a surface. Such a local shape abnormality on a surface is introduced, usually, onto a silicon wafer surface by mechanical or chemical processing. As an example, a polished wafer is manufactured, usually, through sequential processes such as rough polishing, etching and mirror polishing (finish polishing) and has a polished surface (mirror surface) on the surface. There are cases where a defect may be introduced onto the polished surface due to a processing process such as polishing. An example of such a defect includes a linear defect. The linear defect means a linear concave defect or a linear convex defect, but does not require to be a perfect straight line in a plan view. For example, a linear concave or convex defect present on a polished surface of a polished wafer is generally referred to as a scratch and is usually introduced by polishing. Furthermore, the convex defect also includes a defect that is referred to as a PID (Polished Induced Defect). The PID is usually introduced onto a polished surface of a polished wafer by mirror polishing. As described above, in an embodiment, defects are process-induced defects that are introduced onto a silicon wafer surface in a processing process performed in a manufacturing process of the silicon wafer.

On the other hand, another embodiment of an abnormality is a surface-adhering foreign substance and is generally referred to as a particle.

The determination-target abnormality in the evaluation method can be an abnormality of any embodiment described above. Regardless of kinds of abnormalities, various kinds of abnormalities present on a surface of an evaluation-target silicon wafer can be set as determination-targets, or a certain specified abnormality can be selectively set as a determination-target. In the above evaluation method, the presence or absence of an abnormality on a surface of an evaluation-target silicon wafer is determined through two-stage determinations of the first determination and the second determination. Details of the determination of an abnormality will be described below in more detail.

First Determination

In the first determination, the presence or absence of an abnormality is determined by inspecting a surface of an evaluation-target silicon wafer with a light scattering type surface inspection device. Light scattering type surface inspection devices of well-known configuration can be used as the light scattering type surface inspection device, without any limitation. Usually, a light scattering type surface inspection device scans a surface of an evaluation-target silicon wafer with laser light and measures light scattering intensity from an abnormality present on the surface, and thereby recognizes a location and an optical dimension of the abnormality. Ultraviolet light, visible light and the like can be used as the laser light, and a wavelength thereof is not particularly limited. The ultraviolet light means light in a wavelength region less than 400 nm, and the visible light means light in a wavelength region of 400 mm to 600 nm. Specific examples of commercially available light scattering type surface inspection devices include Surfscan series SP1, SP2, SP3, SP5 and the like manufactured by KLA TENCOR Corporation. However, these devices are exemplification, and other light scattering type surface inspection devices can be used.

The inspection by a light scattering type surface inspection device in the first determination can be performed by scanning a part of a surface of an evaluation-target silicon wafer with laser light, or by scanning the entire surface. The light scattering type surface inspection device is a device capable of easily inspecting the entire surface, and thus, in the first determination, it is preferable that the light scattering type surface inspection device inspects the entire surface of an evaluation-target silicon wafer with the light scattering type surface inspection device and determines the presence or absence of an abnormality on the entire surface.

Second Determination

In the second determination, after the first determination, a region where the presence of an abnormality has not been confirmed in the first determination is observed with an atomic force microscope (AFM) and the presence or absence of an abnormality is determined. The two-stage determinations in this way make it possible to detect, with an AFM, a minute abnormality difficult to be detected with a light scattering type surface inspection device. As a result, as compared with conventional evaluations in which only a light scattering type surface inspection device is used, it becomes possible to evaluate, with higher sensitivity, a presence state of an abnormality on a silicon wafer surface. As to a light scattering type surface inspection device, a possibility may be assumed that an abnormality not detected with a conventional light scattering type surface inspection device will become detectable in the future along with the progress of increase in sensitivity. In contrast, according to the above evaluation method, it is possible to detect abnormalities difficult to be detected with a light scattering type surface inspection device, prior to the progress of the increase in sensitivity of a light scattering type surface inspection device.

Measurement modes of an AFM are roughly classified into a contact mode and a noncontact mode. In the contact mode, a sample surface is scanned with a probe attached to the tip end of a cantilever while the probe is in contact with the sample surface. On the other hand, in the noncontact mode, an upper side of a sample surface is scanned with a probe while the probe and the sample surface are set to a noncontact state and a certain space is kept between the probe and the sample surface. The observation with an AFM in the second determination can be performed by either mode. The observation with an AFM in the second determination is preferably performed so as to be capable of detecting an abnormality: having a size equal to or less than a lower detection limit of a light scattering type surface inspection device in the first determination; or having a size that strongly tends to be overlooked with a light scattering type surface inspection device. Therefore, observation conditions with an AFM are preferably set so as to give higher detection sensitivity of foreign substances than that of a light scattering type surface inspection device used in the first determination. For example, as to a probe of an AFM, a smaller tip curvature radius gives higher detection sensitivity of an abnormality with the AFM. Accordingly, as a probe of an AFM, it is preferable to use a probe having a tip curvature radius capable of detecting an abnormality: having a size equal to or less than a lower detection limit of a light scattering type surface inspection device in the first determination; or having a size that strongly tends to be overlooked with a light scattering type surface inspection device. As an example, the curvature radius of a probe of an AFM can be approximately 1 nm to 5 nm. However, the detection sensitivity for an abnormality with an AFM can also be enhanced, for example, by the increase in imaging pixel number of an AFM, and thus the curvature radius of a probe of an AFM is not limited to the above range. The imaging pixel number can be set to 512 pixel ×256 pixel as an example, but is not limited to this value.

As to, for example, a linear defect, according to the study by the present inventor, the presence of a linear defect strongly tends to be confirmed with a light scattering type surface inspection device when the width exceeds 200 nm, and strongly tends to be overlooked when the width is equal to or less than 200 nm. Here, the width with respect to a linear defect means a direct distance from one end of a defect shape (linear shape) in plan view to the other end. As a consequence of detecting, with an AFM, a linear defect having a width of equal to or less than 200 nm which strongly tends to be overlooked in the inspection with a light scattering type surface inspection device, it becomes possible to evaluate a presence state of an abnormality on a surface of an evaluation-target silicon wafer, with higher sensitivity than an evaluation performed by only a light scattering type surface inspection device. According to an AFM, it is possible to detect a linear defect having, for example, a width of 80 nm to equal or less than 200 nm. However, it is also possible to detect, with an AFM, a linear defect having a width exceeding 200 nm but having been overlooked in an inspection with a light scattering type surface inspection device.

The observation with an AFM in the second determination is performed in at least a part of a region where the presence of an abnormality has not been confirmed in the first determination, and the observation can be performed in the whole of such a region or in a specified region. In order to reliably detect the presence or absence of an abnormality in a specified region such as a central portion of a surface of an evaluation-target silicon wafer, an R/2 portion (the central portion thereof along the radius direction) or an edge portion, the second determination can be performed in only such a specified region.

By the use of a determination result obtained by the first determination and a determination result obtained by the second determination, it is possible to evaluate a silicon wafer on the basis of the presence state of an abnormality on the silicon wafer surface. Evaluation items can include the number, distribution state and the like of abnormalities whose presence has been confirmed (detected) on a silicon wafer surface. Examples of evaluation standards which can be shown include: setting a threshold with respect to the sum of the number of abnormalities detected in the first determination and the number of abnormalities detected in the second determination and determining to be at an acceptable level having a small number of abnormalities when the total number is equal to or less than the threshold; performing mapping evaluation of abnormalities by the use of determination results of the first determination and second determination and determining to be at an unacceptable level when an abnormal distribution state, in which abnormalities are locally densified on a silicon wafer surface, has been confirmed; determining to be at an unacceptable level when it has been confirmed that an abnormality is present at a specified location from which the presence of an abnormality is to be excluded; and the like. These evaluation results can be utilized for: determining necessity for a process maintenance work for a silicon wafer; determining to be good or defective in sampling inspection; and the like. Details of these will be described later.

According to the above-described evaluation method according to an aspect of the present invention, a presence state of an abnormality on a silicon wafer surface can be evaluated with higher sensitivity than that of an evaluation using only a light scattering type surface inspection device.

Method of Evaluating Silicon Wafer Manufacturing Process

An aspect of the present invention relates to a method of evaluating a silicon wafer manufacturing process, which includes: evaluating a silicon wafer manufactured in an evaluation-target silicon wafer manufacturing process by the above evaluation method; and determining, on the basis of a result of the above evaluation, necessity of a process maintenance work for the evaluation-target silicon wafer manufacturing process.

Hereinafter, the above silicon wafer manufacturing process evaluation method will be described in more detail.

Processes for manufacturing various kinds of silicon wafer previously described can be listed as an evaluation-target silicon wafer manufacturing processes. For example, a polished wafer can be manufactured through manufacturing processes including: cutting-off (slicing) of a silicon wafer from a silicon single crystal ingot grown through a Czochralski process (CZ process) or the like; rough polishing (for example, lapping); etching; mirror polishing (finish polishing); and cleaning performed between the processing processes or after the processing process. Furthermore, an annealed wafer can be manufactured by subjecting a polished wafer manufactured as described above to an annealing treatment. An epitaxial wafer can be manufactured by causing an epitaxial layer to grow in vapor phase (epitaxial growth) on a surface of a polished wafer manufactured as described above. It is possible to determine necessity of process maintenance works for the manufacturing processes of such various kinds of silicon wafers by the above silicon wafer manufacturing process evaluation method. The process maintenance work means performing, in a manufacturing process, at least one selected from the group consisting of: replacement of a member of a manufacturing apparatus; repair of a member; cleaning of a member; and replacement of a liquid medicine. For example, deterioration of a member or a liquid medicine, or the like causes introduction of an abnormality onto a surface of the silicon wafer to be manufactured in the silicon wafer manufacturing process. In contrast, as a consequence of performing the process maintenance work as described above, it is possible to suppress the introduction of an abnormality onto a silicon wafer surface to be manufactured in the silicon wafer manufacturing process. However, it is not easy and inefficient to determine, without any indicator, the necessity of a process maintenance work. In contrast, in the above silicon wafer manufacturing process evaluation method, on the basis of a result obtained by evaluating a silicon wafer manufactured in an evaluation-target silicon wafer manufacturing process by the silicon wafer evaluation method according to an aspect of the present invention, the necessity of a process maintenance work for the evaluation-target silicon wafer manufacturing process is determined. That is, the necessity of a process maintenance work can be determined using, as an indicator, the result obtained by evaluating a silicon wafer by the silicon wafer evaluation method according to an aspect of the present invention. The necessity of a process maintenance work can be determined on the basis of, for example, the above-described evaluation standards regarding a silicon wafer. Determination standards such as a threshold for determining that a process maintenance work is required are not particularly limited, and can be set in accordance with quality demanded for a product silicon wafer.

When a process maintenance work has been determined to be necessary as a result of the evaluation, a process maintenance work for the silicon wafer manufacturing process is performed. The process maintenance work is as previously described. As an example, when a process maintenance work for a polishing process is to be performed in a polished wafer manufacturing process, specific embodiments of the process maintenance works can include replacement of abrasive cloth, replacement of slurry containing abrasive grains, and the like. For example, there are cases where degradation of abrasive cloth or slurry may cause introduction of a linear concave or convex defect referred to as a scratch onto a polished surface of a polished wafer. When a scratch present on a polished surface of a polished wafer manufactured in the evaluation-target manufacturing process is evaluated on the basis of the silicon wafer evaluation method according to an aspect of the present invention and a process maintenance work for the polishing process is performed on the basis of the obtained result (a presence state of the scratch on the polished surface), it becomes possible, after the process maintenance work, to suppress the introduction of a scratch onto a polished surface of a polished wafer.

Method of Manufacturing Silicon Wafer, Silicon Wafer

An aspect of the present invention relates to a method of manufacturing a silicon wafer (hereinafter, referred to as a "manufacturing method 1"), which includes manufacturing a silicon wafer in a silicon wafer manufacturing process, and further includes: evaluating at least one silicon wafer manufactured in the above silicon wafer manufacturing process by the above evaluation method; determining, on the basis of a result of the above evaluation, necessity of a process maintenance work for the above silicon wafer manufacturing process; and manufacturing furthermore, when the process maintenance work has been determined to be unnecessary as a result of the determination, a silicon wafer in the above silicon wafer manufacturing process without the process maintenance work, or manufacturing furthermore, when the process maintenance work has been determined to be necessary, a silicon wafer in the above silicon wafer manufacturing process after performing the process maintenance work for the above silicon wafer manufacturing process.

The manufacturing method 1 includes: evaluating a silicon wafer manufacturing process by the above-described silicon wafer manufacturing process evaluation method according to an aspect of the present invention; and performing a process maintenance work as necessary. Details of the evaluation of a manufacturing process and of the process maintenance work are as previously described. As a consequence of determining the necessity of a process maintenance work and performing a process maintenance work as necessary in this way, it becomes possible to provide a high-quality silicon wafer in which the introduction of an abnormality onto a surface has been suppressed. In a silicon wafer manufacturing process, usually, manufacturing of a plurality of silicon wafers is continuously or intermittently performed. The number of silicon wafers to be subjected to the evaluation may be equal to or more than one among the plurality of silicon wafers thus manufactured, may be equal to or more than two, and the number of silicon wafers to be subjected to the evaluation is not particularly limited.

An embodiment of the manufacturing method 1 is a polished wafer manufacturing method, and details thereof such as a process maintenance work are as previously described. However, the manufacturing method 1 is not limited to a polished wafer manufacturing method, and can be any manufacturing methods of various kinds of silicon wafers previously exemplified.

Moreover, an aspect of the present invention relates to a method of manufacturing a silicon wafer (hereinafter, referred to as a "manufacturing method 2"), which includes: preparing a silicon wafer lot containing a plurality of silicon wafers; extracting at least one silicon wafer from the lot; evaluating the extracted silicon wafer; and subjecting at least one silicon wafer included in the same lot as that of the silicon wafer determined to be a good product by the above evaluation to preparation for shipping as a product silicon wafer, wherein the evaluation of the above extracted silicon wafer is performed by the above evaluation method.

The manufacturing method 2 includes: performing a lot sampling inspection; and evaluating a sampled silicon wafer by the silicon wafer evaluation method according to an aspect of the present invention. Then, as a result of the evaluation, when the sampled silicon wafer has been determined to be a good product, at least one silicon wafer included in the same lot as that of the silicon wafer is subjected to preparation for shipping as a product silicon wafer. On the other hand, when the sampled silicon wafer has been determined to be a defective product, it is not shipped as a product, or is subjected to preparation for shipping as a product silicon wafer, after having been subjected to a process for removing or reducing an abnormality. In this way, it becomes possible to provide a high-quality silicon wafer in which the introduction of an abnormality onto the surface has been suppressed. Examples of the preparation for shipping as a product silicon wafer include packing and the like.

In the manufacturing method 2, whether a sampled and evaluated silicon wafer is a good product or a defective product can be determined on the basis of the above-described evaluation standards with respect to a silicon wafer. Determination standards for determining to be a defective product such as a threshold are not particularly limited, and can be set in accordance with qualities demanded for a product silicon wafer. In addition, a silicon wafer to be sampled can be equal to or more than one silicon wafer in a lot, can also be equal to or more than two, and the number of silicon wafers to be sampled is not particularly limited.

An embodiment of the manufacturing method 2 is a polished wafer manufacturing method, and the silicon wafer lot is a polished wafer lot. Details of a polished wafer manufacturing method are as previously described. However, the manufacturing method 2 is not limited to a polished wafer manufacturing method, and can also be any manufacturing methods of various kinds of silicon wafers previously exemplified.

According to the manufacturing method 1 or manufacturing method 2, as a result of evaluating a presence state of an abnormality on a surface of a silicon wafer, with higher sensitivity than that of an evaluation performed by only a light scattering type surface inspection device, it is possible to provide a high-quality silicon wafer in which the presence thereof has been reduced or eliminated. As a result, it becomes possible to provide a silicon wafer in which no linear defect having a width of equal to or less than 200 nm is present on the surface. That is, according to an aspect of the present invention, a silicon wafer in which no linear defect having a width of equal to or less than 200 nm is present on the surface is provided. Furthermore, according to an aspect of the present invention, a silicon wafer manufactured by the manufacturing method 1 or the manufacturing method 2 is also provided. In an embodiment, such a silicon wafer can be a polished wafer, but is not limited to this and can also be each of various kinds of silicon wafers previously exemplified.

EXAMPLES

Hereinafter, the present invention will be further explained on the basis of Examples. However, the present invention is not limited to embodiments shown in Examples.

1. Preparation of Evaluation-Target Silicon Wafer (Polished Wafer)

A silicon wafer having been cut off (sliced) from a silicon single crystal ingot grown through a CZ process was subjected to rough polishing (lapping), etching with an etching liquid, minor polishing (finish polishing) and cleaning to thereby give a polished wafer having a diameter of 300 mm.

2. First Determination

The entire polished surface of the polished wafer prepared in the 1 was scanned with laser light by the use of Surfscan series SP3 manufactured by KLA TENCOR Corporation in an HSN (High-Sensitivity-Normal) mode as a light scattering type surface inspection device, and thus a linear defect was detected.

3. Second Determination

Plural locations in the region where no linear defect had been detected in the first determination in the 2 were observed with an AFM, and a linear defect was detected.

Measurement conditions of the AFM were set as: probe tip curvature radius being 2 nm to 3 nm; number of imaging pixels being 512 pixel×256 pixel; measurement area being 20 μm×20 μm; and measurement mode being noncontact mode.

4. Evaluation Results

FIG. 1 illustrates a schematic view of linear defects observed on the surface of the evaluation-target polished wafer. In FIG. 1, linear defects shown with solid lines are linear defects confirmed with the light scattering type surface inspection device according to the first determination, and linear defects shown with dotted lines are linear defects confirmed with an AFM according to the second determination. Lengths of the solid lines and dotted lines in the drawing are simply shown schematically.

Figure 2:
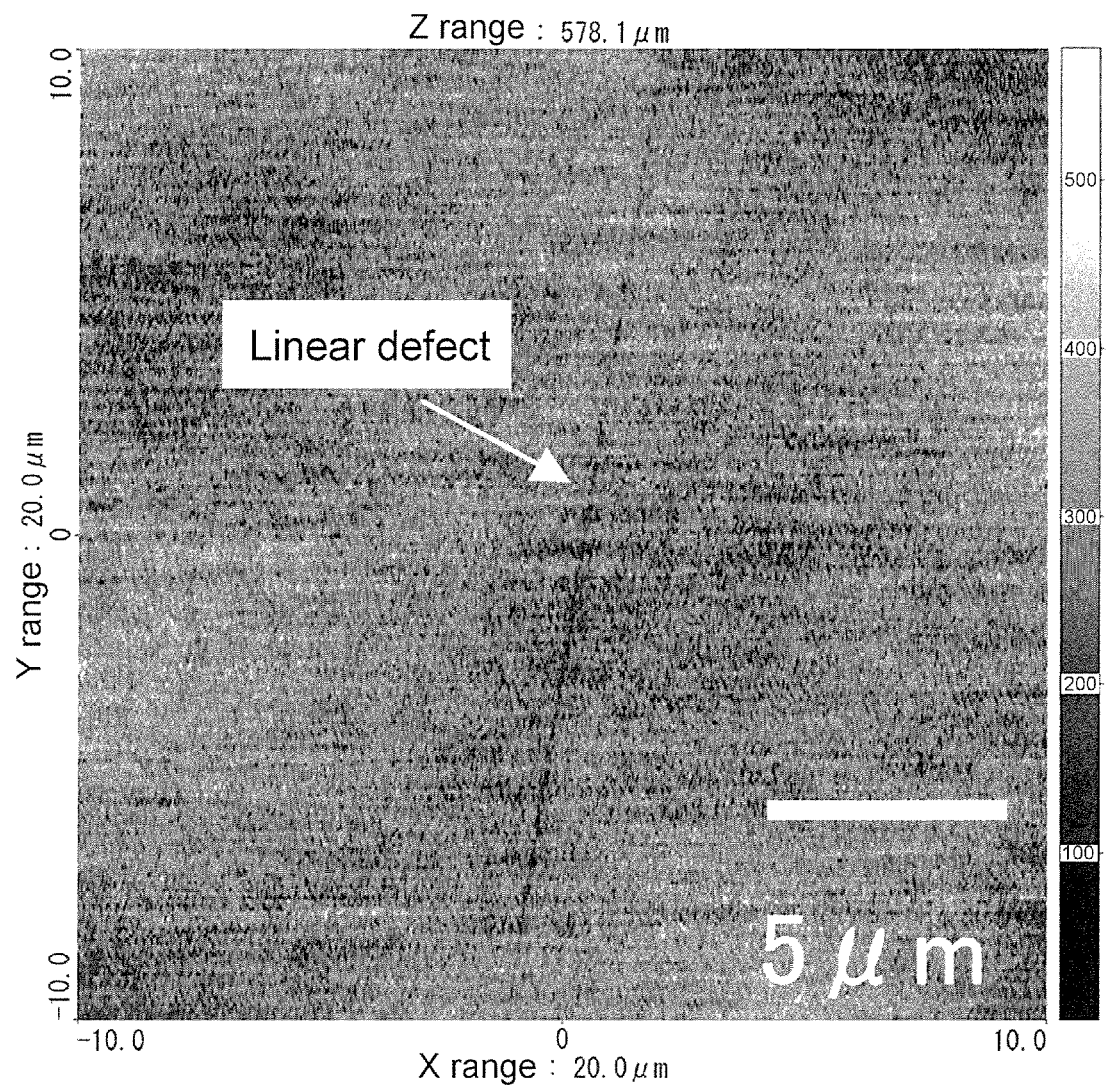
FIG. 2 shows an example of an AFM image of a linear defect confirmed by the second determination in a region where no linear defect has been confirmed by the first determination, in Example.

In the second determination, for example, linear defects were confirmed at seven locations among ten locations in the region where no linear defect had been confirmed in the first determination. An example of an AFM image of each of the linear defects thus confirmed is shown in FIG. 2. The linear defects detected at the seven locations in the second determination were linear defects each having a width of equal to or less than 200 nm (specifically, concave linear defects each having a width of 90 nm to 200 nm).

On the other hand, when seven linear defects were randomly extracted from among linear defects observed in the first determination and were subjected to shape observation with an AFM under the same measurement conditions as those in the 3, each defect thereof was a linear defect and each width thereof exceeded 200 nm (specifically, concave linear defects each having a width of 230 nm to 390 nm).

In consideration of the manufacturing process, each of the concave linear defects is determined to be a scratch generated by the polishing.

Accordingly, after performing replacement of abrasive cloth and slurry to be used in mirror polishing as a process maintenance work for the polishing process, a polished wafer was obtained again by the manufacturing process in the 1. The polished wafer thus obtained after the process maintenance work was subjected to the first determination in the 2 and the second determination in the 3, and as a result, the presence of an abnormality was not confirmed. That is, after the process maintenance work, a polished wafer, in which no linear defect having a width of equal to or less than 200 nm was present on the surface, was obtained.

From the above-described results, it can be confirmed that:

with a light scattering type surface inspection device, linear defects each having a width of equal to or less than 200 nm strongly tend not to be detected; and by the use of an AFM in addition to a light scattering type surface device, it is possible to detect even such linear defects, and accordingly, it becomes possible to detect, with high sensitivity, defects on a silicon wafer surface. Then, by the use of the evaluation result, it becomes possible to perform a process maintenance work as previously described and to provide a silicon wafer in which the introduction of a more minute abnormality onto the surface has been suppressed.

Alternatively, the evaluation method as described above can also be used in a lot sampling inspection, as previously described.

An aspect of the present invention is useful in manufacturing fields of various kinds of silicon wafers.

The invention claimed is:

1. A method of evaluating a silicon wafer, which comprises:
   a first determination that determines presence of a linear defect, having a size equal to or greater than a detection limit of the first determination, in a first region and determines the absence of a linear defect, having a size equal to or greater than a detection limit of the first determination, within a second region of the surface of the evaluation-target silicon wafer by inspecting a surface of an evaluation-target silicon wafer with a light scattering type surface inspection device; and
   a second determination that determines presence or absence of another linear defect, having a size below a detection limit of the first determination, through observing, with an atomic force microscope, within a part of or a whole of the second region of the surface of the evaluation-target silicon wafer.

2. The method of evaluating a silicon wafer according to claim 1, wherein the linear defect, the presence or absence of which is determined by the first determination or the second determination, is a process-induced defect.

3. The method of evaluating a silicon wafer according to claim 1, wherein the linear defect, the presence or absence of which is determined by the first determination or the second determination, is at least one abnormality selected from the group consisting of a concave defect and a convex defect.

4. The method of evaluating a silicon wafer according to claim 1, wherein the evaluation-target silicon wafer is a polished wafer having a polished surface, and the surface where presence or absence of the linear defect is to be determined by the first determination or the second determination is the polished surface.

5. The method of evaluating a silicon wafer according to claim 1, wherein the linear defect, the presence or absence of which is determined by the second determination, comprises a linear defect having a width of equal to or less than 200 nm.

6. The method of evaluating a silicon wafer according to claim 5, wherein the second determination comprises determining presence or absence of the linear defect having a width of equal to or less than 200 nm.

\* \* \* \* \*